United States Patent [19]

Miracky et al.

[11] Patent Number: 5,124,175
[45] Date of Patent: Jun. 23, 1992

[54] METHOD OF PATTERNED METAL REFLOW ON INTERCONNECT SUBSTRATES

[75] Inventors: Robert F. Miracky, Cedar Park; Tom J. Hirsch; Colin A. MacKay, both of Austin, all of Tex.

[73] Assignee: Microelectronics and Computer Technology Corporation, Austin, Tex.

[21] Appl. No.: 614,340

[22] Filed: Nov. 15, 1990

[51] Int. Cl.⁵ .................................. C23C 16/00
[52] U.S. Cl. ........................... 427/98; 427/123; 427/124; 427/125; 427/96; 427/53.1
[58] Field of Search .............. 427/98, 123, 124, 125, 427/96, 53.1

[56] References Cited

U.S. PATENT DOCUMENTS

| | | | |
|---|---|---|---|
| 3,855,693 | 12/1974 | Umbaugh | 29/843 |
| 4,034,468 | 7/1977 | Koopman | 29/825 |
| 4,159,414 | 6/1979 | Suh et al. | 219/121 |
| 4,258,078 | 3/1981 | Celler et al. | 427/43.1 |
| 4,273,859 | 6/1981 | Mones | 427/96 |
| 4,403,410 | 9/1983 | Robinson | 29/830 |
| 4,496,607 | 1/1985 | Mathias | 427/53.1 |
| 4,682,414 | 7/1987 | Butt | 29/840 |
| 4,710,253 | 12/1987 | Soszek | 156/272.8 |
| 4,722,470 | 2/1988 | Johary | 427/282 |
| 4,802,276 | 2/1989 | Bowcutt | 29/840 |
| 4,976,808 | 12/1990 | Ogasawara | 427/98 |
| 4,981,715 | 1/1991 | Hirsch | 427/53.1 |

OTHER PUBLICATIONS

Serial No. 07/422,939.
Serial No. 07/494,897.
Miller, Jr., "Lasers as Reflow Soldering Tools", Hybrid Circuit Technology, Jul. 1988, pp. 27–31.
Soszek, "Circuit-Deposition Techniques For PCBs", Advanced Materials & Processes, Apr. 1989, pp. 33–38.
"New Methods Produce Fine Metal Particles for Conductive Links", Electronic Packaging and Production, Mar. 1990, p. 15.
"Hot-Atom Chemistry Shrinks Conductive Ink", Electronic Design, Mar. 2, 1990, p. 21.
"Printron Process Overview", News Release by Printron, Inc. of Albuquerque, N.M., Mar. 1990.
Hirsch et al., "Selective-Area Electroless Copper Plating on Polyimide Employing Laser Patterning on Catalytic Film", Applied Physics Letters, vol. 57 (13), Sep. 24, 1990, pp. 1357–1359.

Primary Examiner—Shrive Beck
Assistant Examiner—Vi Duong Dang
Attorney, Agent, or Firm—David M. Sigmond

[57] ABSTRACT

Solder reflow on an electrical interconnect substrate between a plurality of electrical contacts. The method includes coating the contacts with tin/lead solder, depositing a wetting metal between the contacts, and heating the substrate to at least the melting point of the solder so that the solder melts, reflows across the wetting metal and connects or links the contacts. The entire surface of a customizable copper/polyimide substrate can be personalized by solder links and TAB leads from surface-mounted integrated circuits can simultaneously be soldered to the substrate.

35 Claims, 6 Drawing Sheets

METHOD OF PATTERNED METAL REFLOW ON INTERCONNECT SUBSTRATES

The U.S. Government has a paid-up license in this invention and the right in limited circumstances to require the patent owner to license others on reasonable terms as provided for by the terms of contact No. J-FBI-89-103 awarded by the Defense Advanced Research Projects Agency (DARPA).

BACKGROUND OF THE INVENTION

1. Field of the Invention

The present invention relates to patterned metal reflow between electrical contacts on electrical interconnect substrates, and more particularly to the use of a reflowable linking metal for selective connection of electrical contacts on a customizable substrate.

2. Description of the Related Art

There is a need for making selective connections between individual electrical conductors on electrical interconnect media such as customizable high density copper/polyimide substrates. Customizable substrates have the property that some of the device interconnections are not made during the initial manufacture of the substrates, but rather are deferred. This deferral allows the substrates to be manufactured in large quantities with generic properties so that the specific design details can be applied later by the user in a final step called "customization." See, for instance, European Patent Application No. 88308996.3 (Publication No. 0310357A2) by Carey, entitled "Customizable Circuitry," which is assigned to the assignee of the present invention. Integral to such customizable substrates is a method for connecting electrical contacts in order to customize a wire routing pattern for a specific configuration of integrated circuits to be surface mounted thereon. Customizable substrates are commonly fabricated with copper conductors and a polyimide dielectric.

The use of lasers to reflow solder on a substrate or printed circuit board is well known. Numerous other solder reflow methods are available, such as vapor phase condensation, conduction, convection, hot plates, ovens, and soldering irons. Lasers, however, have distinct advantages over these other methods in solder reflow operations because the laser energy is focused into a small spot, for instance a few thousandths of an inch or smaller, without heating the surrounding regions. Laser soldering has further advantages of controlling intermetallics and finer grain structures which provide failure rates as low or lower than those of wire-wrap connections. Laser exposure energy levels and times can be accurately and repeatably controlled wherein the solder becomes molten and wets to form a reflowed solder joint.

Various laser soldering techniques include: 1) Direct reflow soldering in which tinned component leads can be reflowed to tinned pads without adding further solder by "stepping" a laser beam from joint to joint or scanning across the board if all the components are wetted with flux; and 2) Reflow soldering with solder paste in which solder paste is applied to clean untinned leads and a laser is used to melt the solder paste.

The use of a laser heating process by itself, however, has not been demonstrated to cause molten metal such as solder to wet on the polyimide surface of a copper/polyimide substrate. Instead, the molten metal will merely ball-up on the polyimide surface rather than flow across the polyimide and form a reliable electrical connection between copper conductors. Therefore, there is a need for a selective patterning process, which may employ a laser, that can make conductive connections between spaced electrical contacts on copper/polyimide substrates as well as other high density electrical interconnects.

SUMMARY OF THE INVENTION

The present invention relates to patterned metal reflow between electrical contacts on electrical interconnect substrates, and in particular to selectively connecting electrical contacts by a combination of a wetting material or metal and a linking metal. The wetting metal is a material which adheres to the substrate and can readily be wetted by a second metal, designated herein as a linking metal. The linking metal is a metal which, after melting, will wet the wetting metal and selected electrical contacts, bond with the wetting metal and contacts, and form an electrically conductive link between the contacts.

The present invention is directed to coating a linking metal on electrical contacts on a substrate, selectively depositing a thin wetting metal between the electrical contacts (either before of after the contacts are coated with linking metal), heating the substrate to at least the melting point of the linking metal so that the linking metal wets with the wetting metal and the contacts (but fails to wet other portions of the top of the substrate) and reflows across the wetting metal between the electrical contacts, and cooling the substrate so that the linking metal solidifies and forms a reliable electrical connection between the contacts corresponding to the wetting metal pattern.

An object of the present invention is to provide a method of reflowing linking metal on an electrical interconnect substrate between a first and second electrical contact, by coating the first electrical contact with a linking metal and depositing a wetting metal between the first and second electrical contacts, then heating the substrate to at least the melting point of the linking metal so that the linking metal melts, reflows across the wetting metal and connects the first and second electrical contacts.

Another object of the present invention is wherein the wetting metal is selected from the group consisting of silver, gold, copper, nickel, lead, palladium, cobalt, indium, platinum, rhenium, osmium and tin.

A further object of the present invention is wherein the linking metal is solder, such as a tin or various tin alloys including tin/lead, tin/silver, and tin/copper.

A still further object of the present invention is to provide a linking metal reflow method wherein the wetting metal is deposited by various techniques such as laser decomposition of solid films, laser modification of solid films, laser patterned plating, laser chemical vapor deposition, and thin film evaporation through a mask.

Still a further object of the present invention is wherein the electrical contacts are copper.

A still further object of the present invention is wherein the wetting metal is copper at least one micron thick.

Yet another object of the present invention is to provide for mounting an integrated circuit chip on the substrate by reflowing linking metal between tape-automated-bonding (TAB) outer leads and the substrate at the same time linking metal is reflowed between the first and second electrical contacts.

Another object of the present invention is a method of electrically connecting a plurality of electrical contacts extending above a dielectric on a substrate, comprising the following steps in the sequence set forth: (1) depositing a wetting metal on the substrate between first and second electrical contacts to form a continuous path therebetween; (2) depositing a linking metal on the wetting metal; (3) heating the substrate to at least the melting point of the linking metal so that the linking metal melts; and (4) cooling the substrate so that the linking metal solidifies and adheres well to the wetting metal and the electrical contacts wherein the linking metal on the substrate forms an electrically conductive link between the first and second electrical contacts in a pattern corresponding to the wetting metal.

Still another object of the present invention is wherein a solder cream containing the linking metal is deposited on the entire surface of the substrate.

An advantage of the present invention is higher throughput and smaller link pitch than conventional wirebonding or laser soldering techniques.

Another advantage of the present invention is a method of patterned metal reflow on a substrate with relatively simple equipment without requiring any special chemical environment for the substrate.

Still a further advantage of the present invention is the formation of electrical links by reflowed solder in a laser-defined pattern.

These and other objects, features, and advantages of the present invention will be more readily apparent from a review of the detailed description and preferred embodiments that follow.

DETAILED DESCRIPTION OF THE PREFERRED EMBODIMENTS

Figure 1:
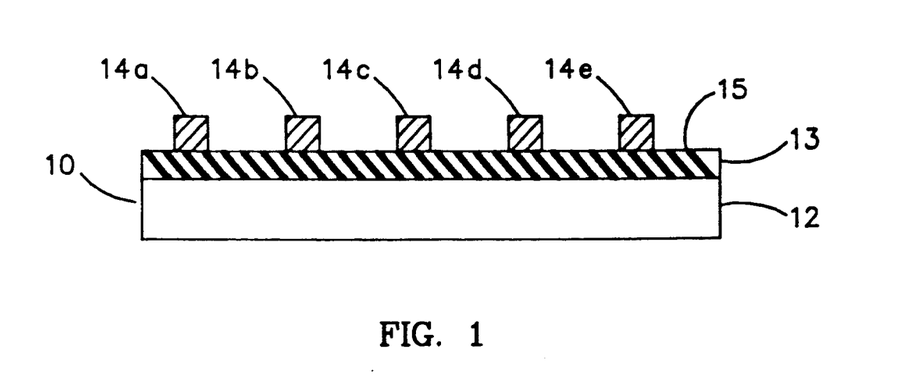
FIG. 1 illustrates a cross-sectional view of electrical contacts on a substrate in accordance with a first embodiment of the invention.

Referring now to the drawings and particularly FIG. 1, an electrical interconnect substrate such as a printed circuit board or copper/polyimide substrate is generally shown as substrate 10. Substrate 10 includes a base 12 of any suitable material, such as silicon, alumina ceramic, aluminum nitride, a metallic material, or glass ceramic. If base 12 is an electrical conductor then insulating layer 13, such as 10 microns of polyimide, can be disposed on base 12. Electrical contacts 14, shown as contacts 14a, 14b, 14c, 14d and 14e are spaced pads or bumps disposed on and extending above top surface 15 of substrate 10. A preferred conductor for contacts 14 is copper, although other suitable conductors include aluminum, gold, and tungsten. Copper deposition methods such as electroless deposition and electroplating are well known in the art. By way of example contacts 14a–14e can be 30 microns wide, 30 microns long, 5 microns high, and spaced 20 microns apart.

Figure 2:
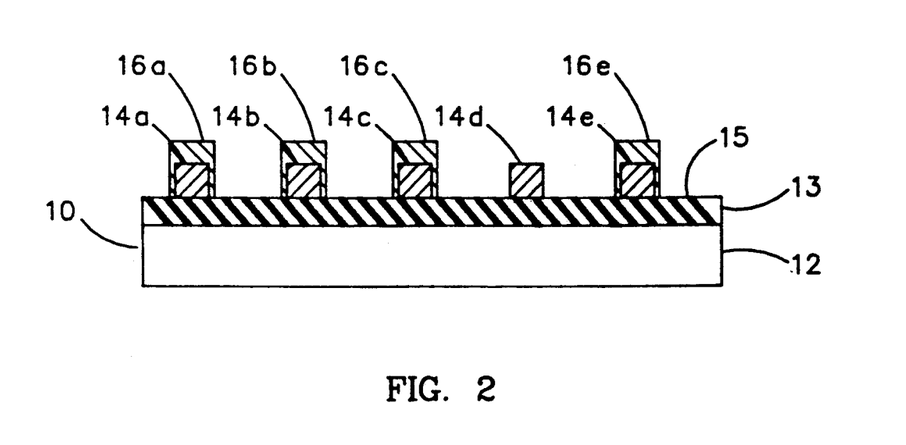
FIG. 2 illustrates a cross-sectional view similar to FIG. 1 including a linking metal coated on some of the contacts.

Referring now to FIG. 2, linking metal 16 such as tin/lead solder alloy is coated over selected contacts 14. As shown contact 14a is coated with linking metal 16a, contact 14b is coated with linking metal 16b, contact 14c is coated with linking metal 16c, and contact 14e is coated with linking metal 16e. However, contact 14d remains uncoated. Linking metal 16 should have a lower melting point then base 12, insulating layer 13, or contacts 14, preferably much lower. For copper/polyimide substrates any generic solder is suitable, such as a tin/lead alloy. Other acceptable linking metals include pure tin, indium, and alloys of tin/cadmium, tin/silver, tin/lead/silver, gold/tin and tin/copper. Returning to the example, linking metal 16 can be 5 microns thick. The linking metal 16 can be applied to contacts 14 in any conventional manner. For instance, substrate 10 can be dipped in a pot of molten solder metal if it is desired to solder coat all copper contacts 14 and the use of flux is acceptable. Or contacts 14 can be individually and selectively solder coated, with or without flux, by touching a solder wire to contacts 14 on a heated substrate 10.

Figure 3:
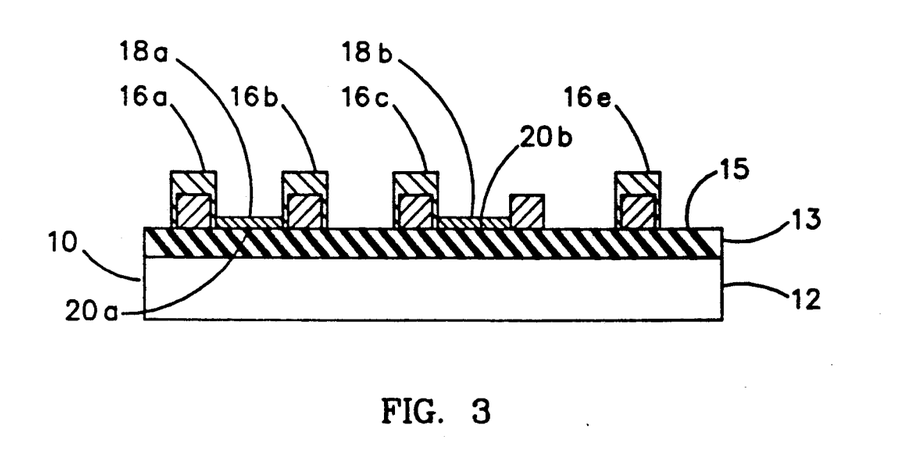
FIG. 3 illustrates a cross-sectional view similar to FIG. 2 including a wetting metal deposited between selected contacts.

Referring now to FIG. 3, a wetting metal 18 is deposited on surface 15 of substrate 10 between whichever contacts 14 are desired to be linked, shown as wetting metal 18a in region 20a between contacts 14a and 14b and wetting metal 18b in region 20b between contacts 14c and 14d. Although the contacts 14 shown in this example are adjacent, non-adjacent contacts 14 may also be linked as long as an uninterrupted path is available therebetween for wetting metal 18. A preferred wetting metal 18 is copper, although other suitable wetting metals include silver, gold, nickel, lead, palladium, cobalt indium, platinum, rhenium, osmium and tin. In accordance with the present invention wetting metal 18 is deposited between contacts 14 desired to later be linked by linking metal 16. Suitable maskless processes for depositing wetting metal 18 include laser decomposition of solid films, laser modification of solid films, laser patterned plating, laser chemical vapor deposition. Suitable processes for depositing wetting metal 18 which make use of a mask include thin film evaporation, as well as photolithographic patterning and photolytic patterning with an ultraviolet excimer laser or incoherent light source. Mask dependent and maskless processes for selectively depositing a thin layer of metal on a substrate are well known to those having skill in the art and will not be described in detail herein. An example of a maskless laser direct-write process for selectively depositing metal on a substrate can be found in U.S. application Ser. No. 07/494,897 by Hirsch et al, entitled "Method For Patterning Electroless Plated Metal On A Polymer Substrate," which is assigned to the assignee of the present invention and hereby incorporated by reference. Mask utilizing processes tend to be faster then maskless processes once the mask is fabricated, but maskless processes typically are faster and more economical for prototyping or small volume manufacturing applications. Thus, wetting metal 18 can be deposited between contacts 14 by a wide variety of techniques, either with or without a mask, and either with or without laser control. The preferred deposition process for wetting metal 18 is laser modification of solid films which allows laser-controlled patterning using solid films in air; see, for instance, Hirsch et al, "Selective-area electroless copper plating on polyimide employing laser patterning of a catalytic film," *Applied Physics Letters*, vol. 57 (13), Sep. 24, 1990, pp. 1357-1359. For illustration purposes wetting metal 18 is shown as 1 micron of copper deposited by laser modification. Wetting metal 18 should be as thin as possible, however too thin a wetting metal, for instance 0.1 microns of copper, may be stripped off the substrate when linking metal 16 melts and reflows thereon. Preferably wetting metal 18 will be adjacent to but not overlapping with linking metal 16. Depositing wetting metal 18 over linking metal 16 may impede the reflow of linking metal, but this is more desirable than leaving a substantial gap in the solder reflow path between wetting metal 18 and a contact 14 to be linked since an incomplete link and open-circuit may result.

In the illustration set forth contacts 14 have been coated with a linking metal 16 before depositing the wetting metal 18 between selected contacts 14. It is understood, however, that if desired, wetting metal layer 18 can be deposited on substrate surface 15 between selected contacts 14 before coating any contacts 14 with linking metal 16.

Figure 4:
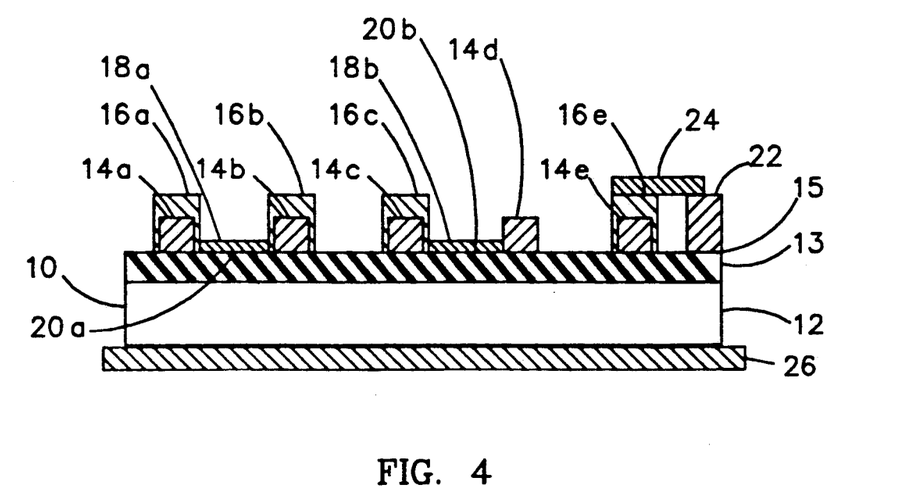
FIG. 4 illustrates a cross-sectional view similar to FIG. 3 including an electronic component on the surface of the substrate.

Referring now to FIG. 4, electronic component 22 is shown with outer TAB lead 24 aligned and in contact with contact 14e. Although not essential to the present invention, electronic component 22 is included to illustrate an additional feature of the present invention wherein a component 22 can be surface mounted or bonded to substrate 10 by linking metal 16 at the same time the substrate is heated and linking metal 16 is reflowed over wetting metal 18 between contacts 14. This reduces the additional processing step of bonding component 22 after substrate 10 is customized.

Figure 5:
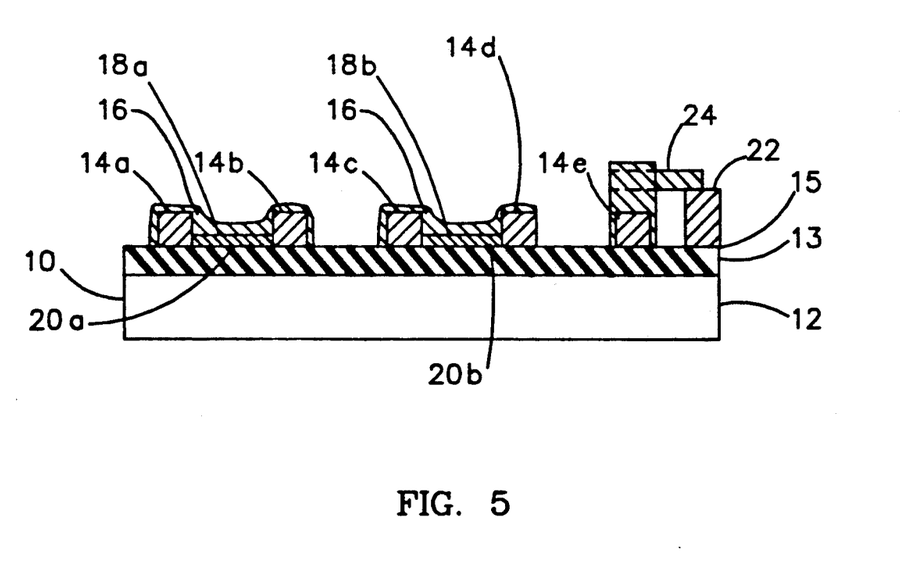
FIG. 5 illustrates a cross-sectional view similar to FIG. 4 in which the substrate has been heated on a hot plate and the linking metal has reflowed along the wetting metal between the contacts and simultaneously the linking metal has reflowed and bonded the lead of an electronic component to the substrate.

Referring now to FIG. 5, substrate 10 is headed to at least the melting point of linking metal 16 so that linking metal 16 melts and reflows across wetting metal 18 to link electrical contacts 14 adjacent wetting metal 18. Preferably at all times the temperature of substrate 10 is kept well below the melting points of base 12, insulating layer 13, contacts 14, wetting metal 18, and whatever temperature may pose a hazard to electronic component 22 or lead 24. Substrate 10 can be heated, for instance, by placing substrate 10 on a hot plate 26 at an appropriate temperature for about 10 seconds. This will heat linking metal 16 sufficiently to melt, reflow over wetting metal 18, and form a metal link between contacts 14 without damaging substrate 10 or component 22. Thereafter substrate 10 is cooled below the melting point of linking metal 16. Linking metal 16 solidifies and forms a solid reliable electrical link, in a pattern corresponding to wetting metal 18, between selected contacts 14. In addition, lead 24 of component 22 can simultaneously be bonded to contact 14e on substrate. As shown herein, linking metal 16a and 16b reflows across wetting metal 18a to bond or link linking metal coated contacts 14a and 14b. Likewise, linking metal 16c reflows across wetting metal 18d to link linking metal coated contact 14c and uncoated contact 14d. Concurrently, linking metal coated contact 14e is bonded to lead 24 of electronic component 22.

Advantageously, contacts 14 which are coated with linking metal 16 but not adjacent to any wetting metal 18 are not adversely affected by the solder reflow process. That is, with or without the presence of lead 24, linking metal 16e on contact 14e will not short to an adjacent contact 14 as solder reflow occurs on wetting metal 18 between other contacts 14. Therefore all contacts 14 on substrate 10 can be coated (e.g. solder dipped) with linking metal 16 regardless of which contacts 14 will eventually be linked.

In accordance with the present invention, substrate 10 is now selectively customized and surface mounted component 22 is bonded thereto in a single substrate-wide heating step. Additionally, should tin/lead solder be used for linking metal 16, residue solder flux can be removed from the substrate using commercial flux remover.

Another embodiment of the present invention is shown in FIGS. 6-12 where, unless otherwise specified, like parts are similarly numbered with the addition of the suffix '. In this embodiment the linking metal is deposited over the wetting metal prior to heating the substrate and reflowing the linking metal.

Figure 6:
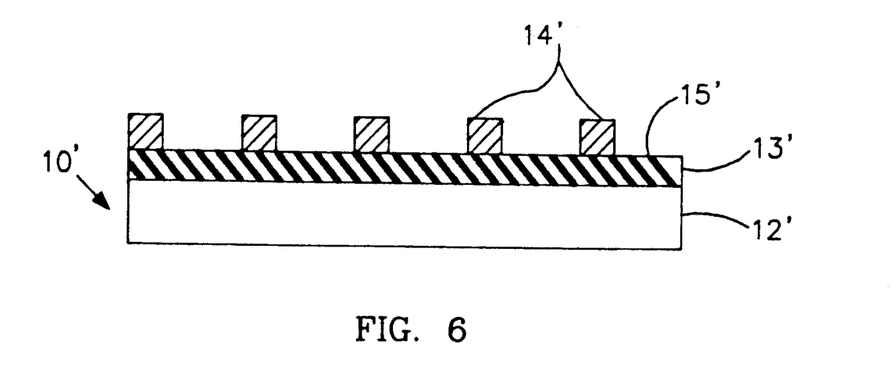
FIG. 6 illustrates a cross-sectional view of electrical contacts on a substrate in accordance with another embodiment of the invention.

With reference now to FIG. 6, substrate 10' includes base 12' and polyimide dielectric layer 13' with spaced electrical contacts 14' extending above substrate top surface 15'.

Figure 7:
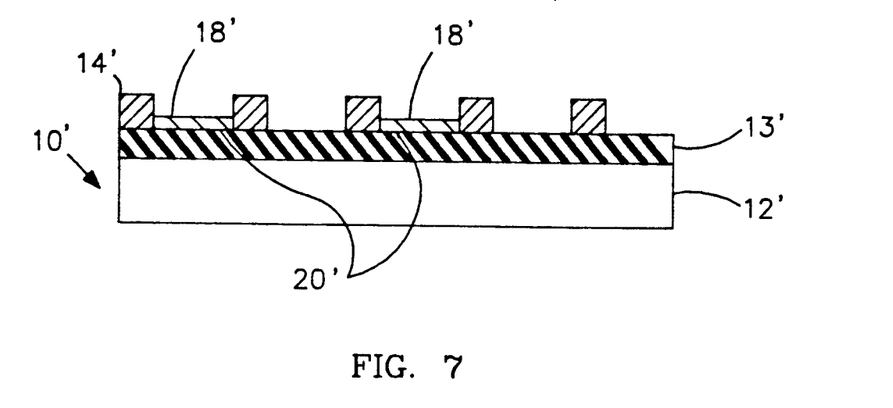
FIG. 7 illustrates a cross-sectional view similar to FIG. 6 including a wetting metal deposited between selected contacts.

Referring now to FIG. 7, wetting metal 18' is deposited in regions 20' between the selected contacts 14' before coating contacts 14' with a linking metal.

Figure 8:
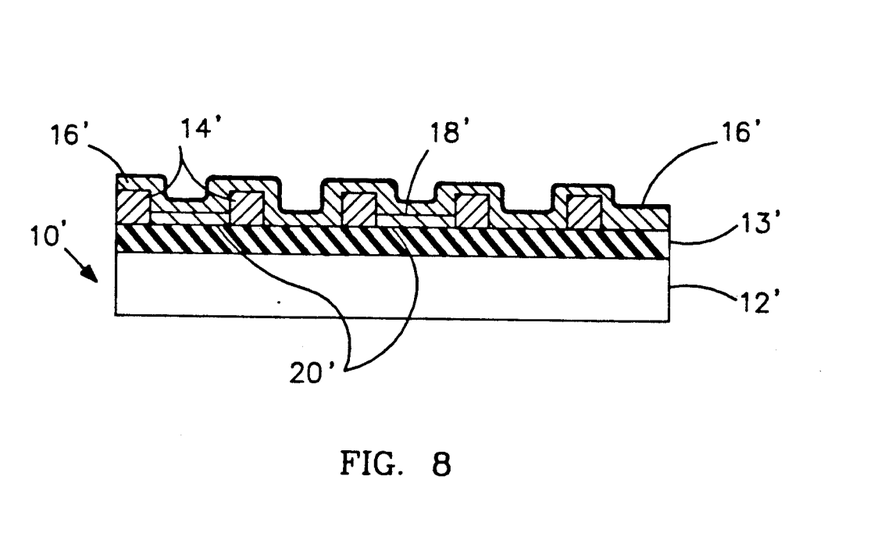
FIG. 8 illustrates a cross-sectional view similar to FIG. 7 including a linking metal deposited over the entire surface of the substrate.

With reference now to FIG. 8, a layer of linking metal 16' is deposited over and coats contacts 16' at a temperature low enough to assure that wetting metal 18' is not damaged or destroyed, more preferably with little or no heating of wetting metal 18'. Several well known techniques can be used to coat the contacts 14' with a linking metal 16' without significantly heating wetting metal 18'. For instance, as shown in FIG. 8, a solder cream containing linking metal 16' can be deposited over the entire surface of substrate 10' as well as on contacts 14'.

In the alternative (not shown), a binary or ternary alloy linking metal 16' (e.g., tin/lead or tin/lead/silver)

can be selectively deposited on wetting metal 18' by chemical vapor deposition (CVD). Examples of tin precursors are tetra-allyl tin and tributyl-tin oxide. An example of a lead precursor is tetra-allyl lead. An example of a silver precursor is silver carbonyl. While CVD has the advantage of applying the linking metal only where it is desired, the forementioned blanket coat of solder cream is much simpler to apply.

Figure 9:
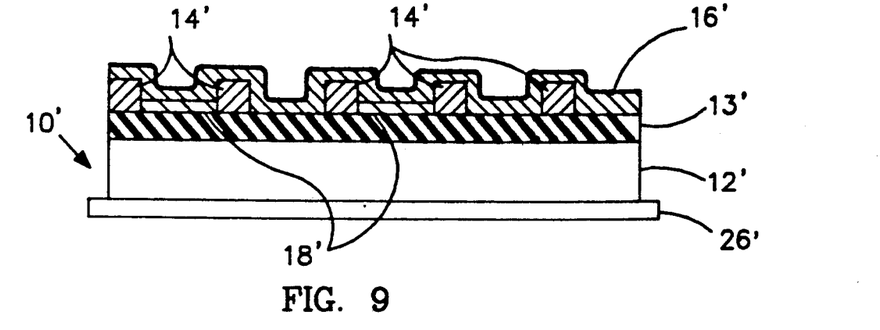
FIG. 9 illustrates a cross-sectional view similar to FIG. 8 in which the substrate is heated and the linking metal becomes molten.

With reference now to FIG. 9, substrate 10' is placed on hot plate 26' and heated to at least the melting point of linking metal 16' which becomes molten. Linking metal 16' wets wetting metal 18' and contacts 14'.

Figure 10:
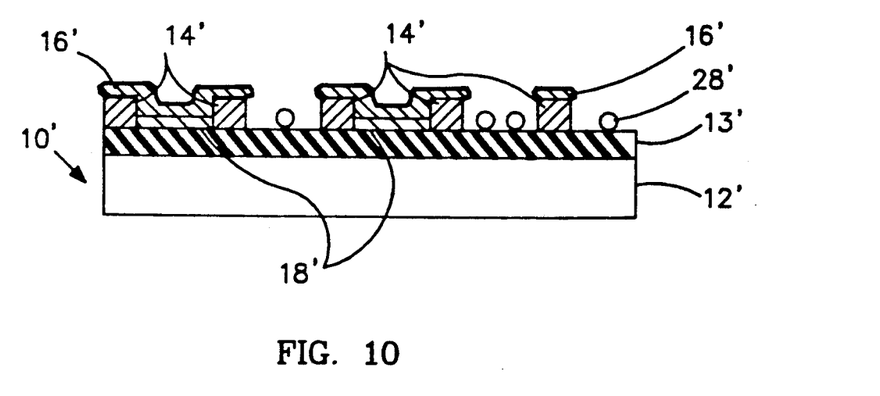
FIG. 10 illustrates a cross-sectional view similar to FIG. 9 wherein the linking metal cools off, solidifies, and adheres well to the metal wetting layer and electrical contacts but fails to adhere well to the dielectric on the substrate.

Referring now to FIG. 10, substrate 10' is removed from hot plate 26' and linking metal 16' cools off and solidifies. The linking metal 16' bonds to and adheres well to metal wetting layer 18' and contacts 14'. However, the portions of linking metal designated as 28' on polyimide 13' ball-up and fail to adhere well to polyimide 13'. Unless removed linking metal balls 28' may cause undesired short-circuits.

Figure 11:
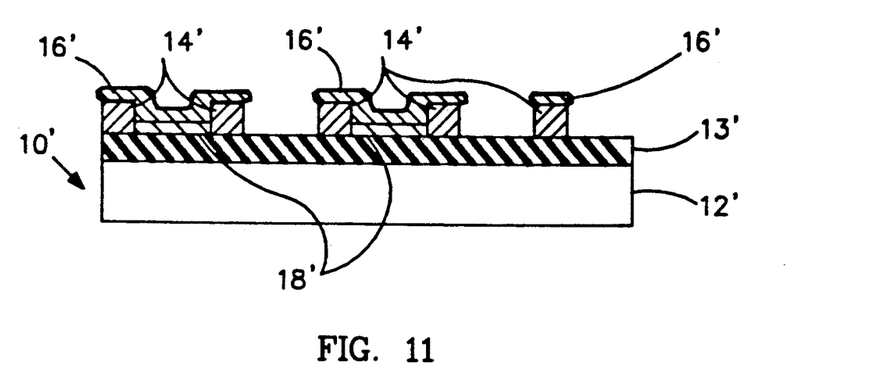
FIG. 11 illustrates a cross-sectional view similar to FIG. 10 illustrating the removal of the non-adhering linking metal.

With reference now to FIG. 11, linking metal balls 28' are removed by a simple conventional cleaning step. It is understood that if linking metal 16' were selectively deposited by CVD on wetting metal 18' but not polyimide 13', instead of by applying the blanket layer of solder cream as shown, then after substrate 10' was heated no balled-up linking metal 28' on polyimide 13' would occur and the cleaning step of FIG. 11 would not be necessary.

Figure 12:
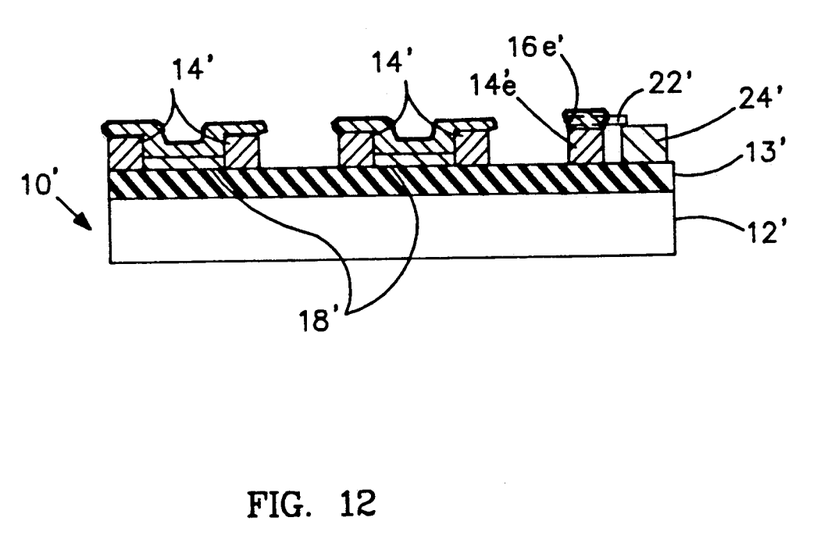
FIG. 12 illustrates a cross-sectional view similar to FIG. 11 illustrating the bonding of a TAB lead extending from a surface mounted component to an electrical contact.

Referring now to FIG. 12, if desired, TAB lead 22' extending beyond the periphery of surface mounted electronic component 24' can be bonded to contact 14e' by contacting lead 22' to linking metal 16e' and heating and reflowing linking metal 16e' to form a bond. If linking metal 16' is selectively deposited over metal wetting layer 18', then the step of FIG. 12 can be eliminated since a surface mounted component 24' could be soldered to contact 14e' as the substrate is heated in FIG. 9.

The present invention will be illustrated further by the following example. This example is meant to illustrate the embodiment depicted in FIGS. 1-5 and not to limit the invention, the scope of which is defined solely by the appended claims.

EXAMPLE 1

Figure 13:
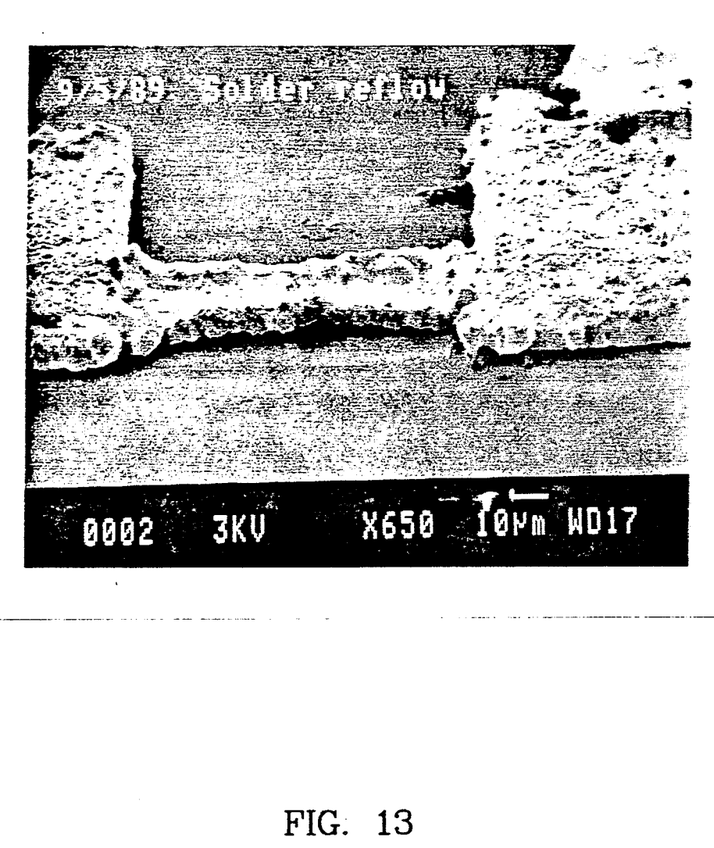
FIG. 13 presents a photomicrograph of a reflowed linking metal link between contacts prepared in accordance with the first embodiment of the present invention.

A copper/polyimide substrate was heated and then the exposed copper contacts were coated with 60/40 tin/lead solder as a linking metal. Solder-flux residue was cleaned from the substrate using commercial flux remover. The substrate was then coated with a thin film of poly(acrylic acid) and a thin film of palladium. An argon laser in the all-lines mode was used to irradiate selective regions of the substrate with an irradiation intensity of about 0.02 watts, a spot diameter of about 30 microns ($1/e^2$), and a scan rate of about 100 microns per second. The non-irradiated film was then etched away in 1M NaOH solution for 30 seconds. A copper wetting metal was plated to the irradiated regions by immersion in a commercial copper electroless plating bath for about 10 minutes. The substrate was then coated with solder flux and placed on a hot plate for about 10 seconds to reflow the solder across the copper wetting layer. Solder-flux residue was then cleaned from the substrate using commercial flux remover. A scanning electron microscope (SEM) photomicrograph of the resultant solder link over the copper wetting metal between copper contacts is shown in FIG. 13. The photomicrograph suggests a solder thickness of more than 1 micron on the copper wetting layer. Energy dispersive spectroscopy was performed on the surface of the link to verify the material was solder.

The present invention is therefore well adapted to carry out the objects and attain the ends and advantages mentioned, as well as others inherent therein. While presently preferred embodiments of the invention have been described for the purpose of disclosure, numerous changes in the materials, arrangement of parts, and steps in the process may be made without departing from the spirit of the present invention and the scope of the appended claims.

What is claimed is:

1. A method of electrically connecting a pair of spaced electrical contacts on a surface of a substrate, comprising:
   coating a linking metal over a first electrical contact without forming a continuous path of linking metal between the first electrical contact and a second electrical contact;
   deposing a wetting metal on the surface to form a continuous path of wetting metal between the contacts;
   heating the substrate to at least the melting point of the linking metal so that the linking metal melts and reflows across the wetting metal to form a continuous path of linking metal corresponding to the continuous wetting metal path between the contacts; and
   cooling the substrate so that the linking metal solidifies in the continuous linking metal path, bonds to the wetting metal and the contacts, and forms an electrically conductive link between the contacts.

2. The method of claim 1 wherein the wetting metal is selected from the group consisting of silver, gold, copper, nickel, lead, palladium, cobalt, indium, platinum, rhenium, osmium and tin.

3. The method of claim 1 wherein the wetting metal deposition is patterned by irradiation.

4. The method of claim 3 further comprising the step of etching the wetting metal from the non-irradiated portions of the substrate prior to reflowing the linking metal.

5. The method of claim 1 wherein at least one of the electrical contacts is copper.

6. The method of claim 1 wherein the linking metal is a metal selected from the group consisting of tin, indium, tin/lead alloy, gold/tin alloy, tin/cadmium alloy, tin/silver alloy, tin/lead/silver alloy and tin/copper alloy.

7. The method of claim 1 wherein the wetting metal is copper at least one micron thick.

8. The method of claim 1 wherein the first and second electrical contacts are adjacent.

9. The method of claim 1, wherein the electrical contacts extend above the substrate.

10. The method of claim 1, further comprising
    contacting a lead of an integrated circuit with a linking metal in contact with an electrical contact on the substrate; and
    reflowing the linking metal between the lead and the electrical contact when the substrate is heated, thereby bonding the lead to the electrical contact.

11. The method of claim 10 wherein the linking metal between the lead and the electrical contact is coated over the electrical contact.

12. The method of claim 10 wherein the lead is a tape-automated-bonding lead extending beyond the periphery of the top surface of an integrated circuit chip.

13. The method of claim 12 wherein the integrated circuit chip is surface mounted on the substrate.

14. A method of reflowing linking metal between first and second spaced electrical contacts which extend above the top surface of a dielectric substrate, comprising:
coating a linking metal over the first and second contacts without depositing a continuous path of the linking metal therebetween;
depositing a wetting metal on the surface in a continuous path between the first and second contacts;
heating the substrate to at least the melting point of the linking metal so that the linking metal melts, reflows across the wetting metal and connects the first and second contacts; and
cooling the substrate so that the linking metal solidifies, bonds to the wetting metal and the contacts but not the surface, and forms an electrically conductive link between the contacts which corresponds to the continuous path of the wetting metal.

15. A method for providing patterned metal reflow on a substrate, comprising:
coating a linking metal over a plurality of spaced electrical contact pads extending above a top dielectric surface on the substrate without depositing the linking metal on the dielectric;
selectively depositing a wetting metal on the top dielectric surface to form continuous wetting metal paths between certain pairs of pads; and then
heating the substrate to at least the melting point of the linking metal so that the linking metal melts, reflows across the wetting metal, and forms a metal link on the wetting metal between said certain pairs of pads, thereby providing a well-adhering reflowed metallization pattern corresponding to the continuous wetting metal paths between said certain pairs of pads.

16. A method of selectively interconnecting a plurality of spaced electrical contact pads extending above a top planar surface on a customizable substrate, comprising:
coating a linking metal over the pads without depositing the linking metal on the surface;
selectively depositing a wetting metal on the surface without depositing the wetting metal over the pads to form a continuous path between the pads;
heating the entire substrate to at least the melting point of the linking metal so that the linking metal melts and reflows across the wetting metal; and
cooling the substrate so that the reflowed wetting metal forms a solid metal link bonded to the wetting metal and the pads but not the surface, thereby customizing the substrate.

17. The method of claims 16 wherein the substrate is not heated to a sufficiently high temperature to melt copper.

18. The method of claims 16 wherein the wetting metal is selected from the group consisting of silver, gold, copper, nickel, lead, palladium, cobalt indium, platinum, rhenium, osmium and tin.

19. The method of claim 16 wherein the wetting metal deposition is patterned by a laser.

20. The method of claim 16 wherein the linking metal reflows between adjacent pads.

21. The method of claim 16 wherein the linking metal is a metal selected from the group consisting of tin, indium, tin/lead alloy, gold/tin alloy, tin/cadmium alloy, tin/silver alloy, tin/lead/silver alloy and tin/copper alloy.

22. The method of claim 16 wherein the wetting metal is copper at least one micron thick.

23. The method of claim 16 wherein the substrate is a copper/polyimide structure.

24. The method of claim 16 further comprising mounting an integrated circuit chip on the substrate by reflowing linking metal between a metal lead interconnected to the chip and a pad on the substrate when the substrate is heated.

25. The method of claim 24 wherein the lead is a tape-automated-bonding lead.

26. A method for providing patterned metal reflow on a substrate, comprising:
coating a linking metal selected from the group consisting of tin, indium, tin/lead alloy, gold/tin alloy, tin/cadmium alloy, tin/silver alloy, tin/lead/silver alloy and tin/copper alloy over a plurality of spaced pads extending above the top surface of the substrate without depositing the linking metal on the surface;
selectively depositing on the surface a wetting metal selected from the group consisting of silver, gold, copper, nickel, lead, palladium, cobalt indium, platinum, rhenium, osmium, and tin in a pattern controlled by a laser to form continuous paths between certain pairs of pads;
heating the substrate to at least the melting point of the linking metal so that the linking metal melts and reflows across the wetting metal; and
cooling the substrate below the melting point of the linking metal to form a solid metal link on the wetting metal between said certain pairs of pads, thereby providing a reflowed linking metallization pattern corresponding to the wetting metal paths between said certain pairs of pads.

27. A method for providing patterned metal reflow on a substrate, comprising:
coating a solder linking metal containing tin over a plurality of spaced adjacent copper pads extending above the top surface of the substrate without forming a continuous path of solder between any pads;
selectively depositing on the surface a copper wetting metal at least one micron thick in a pattern controlled by a laser to form continuous paths between certain pairs of copper pads;
heating the entire substrate to at least the melting point of the solder so that the solder melts and reflows across the copper wetting metal; and
cooling the substrate to form a solid soldered link between said certain pairs of copper pads, thereby providing a reflowed solder pattern corresponding and bonded to the copper wetting metal paths between said certain pairs of copper pads.

28. The method of claim 27 wherein the substrate is a customizable copper/polyimide substrate and the reflowed solder acts to customize the substrate.

29. The method of claim 27 further comprising mounting an integrated circuit chip on the substrate by reflowing the solder between a metal lead interconnected to the chip and a copper pad on the substrate when the substrate is heated.

30. A method of electrically connecting a plurality of electrical contacts on a substrate, comprising the following steps in the sequence set forth:
- depositing a wetting metal on the substrate between first and second electrical contacts to form a continuous wetting metal path therebetween;
- depositing a linking metal over at least the first electrical contact without forming a continuous linking metal path between the first and second electrical contacts; and
- heating the substrate to at least the melting point of the linking metal so that the linking metal melts and reflows off the first electrical contact onto the wetting metal to form an electrically conductive link between the first and second electrical contacts in a pattern corresponding to the continuous wetting metal path therebetween.

31. A method of electrically connecting a plurality of electrical contacts extending above a dielectric on a substrate, comprising the following steps in the sequence set forth:
(1) depositing a wetting metal on the dielectric between first and second electrical contacts to form a continuous wetting metal path therebetween;
(2) depositing a linking metal on the entire substrate;
(3) heating the entire substrate to at least the melting point of the linking metal so that the linking metal melts and wets the wetting metal and the contacts but not the dielectric;
(4) cooling the substrate so that the linking metal solidifies and adheres to the wetting metal and the electrical contacts but fails to adhere to the dielectric; and
(5) removing the non-adhering linking metal from the substrate wherein the linking metal which remains on the substrate forms an electrically conductive link between the first and second electrical contacts in a pattern corresponding to the wetting metal.

32. The method of claim 31 wherein the linking metal is deposited by chemical vapor deposition.

33. A method of electrically connecting a plurality of electrical contacts extending above a dielectric surface on a substrate, comprising the following steps in the sequence set forth:
(1) depositing a wetting metal on the surface between first and second electrical contacts to form a continuous wetting metal path therebetween;
(2) depositing a linking metal over the entire surface of the substrate;
(3) heating the entire substrate to at least the melting point of the linking metal so that the linking metal melts and wets the wetting metal and the electrical contacts but fails to wet the surface;
(4) cooling the substrate so that the linking metal solidifies and adheres to the wetting metal and the electrical contacts but fails to adhere to the surface; and
(5) removing any linking metal in contact with the dielectric but not in contact with the wetting metal or the electrical contacts, wherein the linking metal remaining on the substrate forms an electrically conductive link between the first and second electrical contacts in a pattern corresponding to the continuous wetting metal path.

34. The method of claim 33 wherein the electrical contacts are copper, dielectric is polyimide, and the linking metal contains tin.

35. The method of claim 33 wherein the solder cream containing the linking metal is deposited on the substrate.

* * * * *